United States Patent [19]

Böhringer

[11] 4,214,189
[45] Jul. 22, 1980

[54] REGULATED DEFLECTION CIRCUIT

[75] Inventor: Walter Böhringer, Schlieren, Switzerland

[73] Assignee: RCA Corporation, New York, N.Y.

[21] Appl. No.: 962,174

[22] Filed: Nov. 20, 1978

[30] Foreign Application Priority Data

Jan. 23, 1978 [GB] United Kingdom ............... 2658/78

[51] Int. Cl.² .................... H01J 29/70; H01J 29/76
[52] U.S. Cl. ................................. 315/408; 315/411
[58] Field of Search ................ 315/411, 408; 358/190

[56] References Cited

U.S. PATENT DOCUMENTS

| 4,034,263 | 7/1977 | Dietz | 315/408 |
| 4,071,810 | 1/1978 | Dobbert | 315/400 |

OTHER PUBLICATIONS

Valvo Report, *Thyristor H–Deflection Circuit With Network Isolation*, RCA 72653–U.S. No. 955, 4-15-75.

*Primary Examiner*—Theodore M. Blum
*Attorney, Agent, or Firm*—Eugene M. Whitacre; Paul J. Rasmussen; Joseph H. Laks

[57] ABSTRACT

An input transformer primary winding is series coupled with an unregulated voltage source and a bidirectional switch. The secondary winding is coupled to a deflection circuit switch through a second switch. The transformer leakage inductance serves as the source input impedance. The transformer windings and second switch are so polarized as to provide for simultaneous conduction of the bidirectional and second switches. Regulation is achieved by varying the turn-on instant of the bidirectional switch within a deflection cycle. The bidirectional switch is commutated off by a resonant circuit coupled to the switch.

7 Claims, 21 Drawing Figures

REGULATED DEFLECTION CIRCUIT

BACKGROUND OF THE INVENTION

This invention relates to regulated deflection circuits. Known regulation systems for TV receivers which provide chassis isolation include the following:

(1) Switched Mode Power Supply (SMPS) with free running oscillator. Regulation is achieved by changing only the oscillator frequency or by changing both frequency and pulse width.

(2) SMPS with constant frequency. Regulation is achieved by varying the pulse width of the power transistor or by varying the conduction angle of the switching device. Certain switched mode supplies operate as flyback converters or backwards transformers. That is, the rectifying element on the secondary side of the input transformer is in the conductive state that is opposite that of the switching element on the primary side. Flyback or backwards operated transformers require relatively tight magnetic coupling between the primary and secondary windings. Relatively expensive molded transformers are used. Also, typically, the peak voltage that the semi-conductor switching element is subjected to is relatively large.

(3) SCR deflection circuit with isolation in the input transformer. An SCR regulator is located in the primary side of the input transformer. Commutation of the SCR regulator in one typical circuit is achieved via the leakage inductance of the input transformer and a capacitor located in the secondary side of the input transformer. In such an arrangement, the physical size of the transformer becomes relatively large because the commutation current must be transformed to the primary side. To commutate the SCR properly, the leakage inductance must be relatively small. Therefore, an additional input inductance may be required in the secondary side. Also, with the capacitor located on the secondary side, commutation of the regulator SCR is difficult during the start-up interval.

Commutation of the regulator SCR in another typical circuit is achieved solely by the transformed deflection commutation switch voltage. During start-up, it will be relatively difficult to turn off the regulator SCR. Also, during steady-state operation relatively large currents will flow in the input transformer.

Combining an SCR deflection circuit with a conventional or modified SMPS with a transistor as a switch provides an unsatisfactory combination of a less reliable transistor switch and a reliable thyristor deflection switch. For cost effectiveness, it is better to use only one type of switch, e.g., a thyristor type, for the different types of switching functions.

SUMMARY OF THE INVENTION

A deflection circuit includes at least a first deflection switch for generating first and second intervals. An input transformer includes first and second windings magnetically loosely coupled to each other, for providing a substantial leakage inductance to the flow of current in the transfomer. A regulator bidirectional switch is series coupled with the first winding and a source of operating voltage for controlling the amount of current in said first winding. A second regulator switch is coupled to the secondary winding. The polarities of the first and second windings and of the second switch are such as to provide substantially simultaneous conduction of the bidirectional and second switches. A control circuit is coupled to the bidirectional switch and is responsive to an energy level of the deflection circuit for switching the bidirectional switch into conduction at a variable instant within one of the first and second intervals for providing regulation. A resonant circuit is coupled to the bidirectional switch for coupling a substantially complete cycle of resonant current through the bidirectional switch for commutating off the bidirectional switch.

DESCRIPTION OF THE INVENTION

Figure 1:
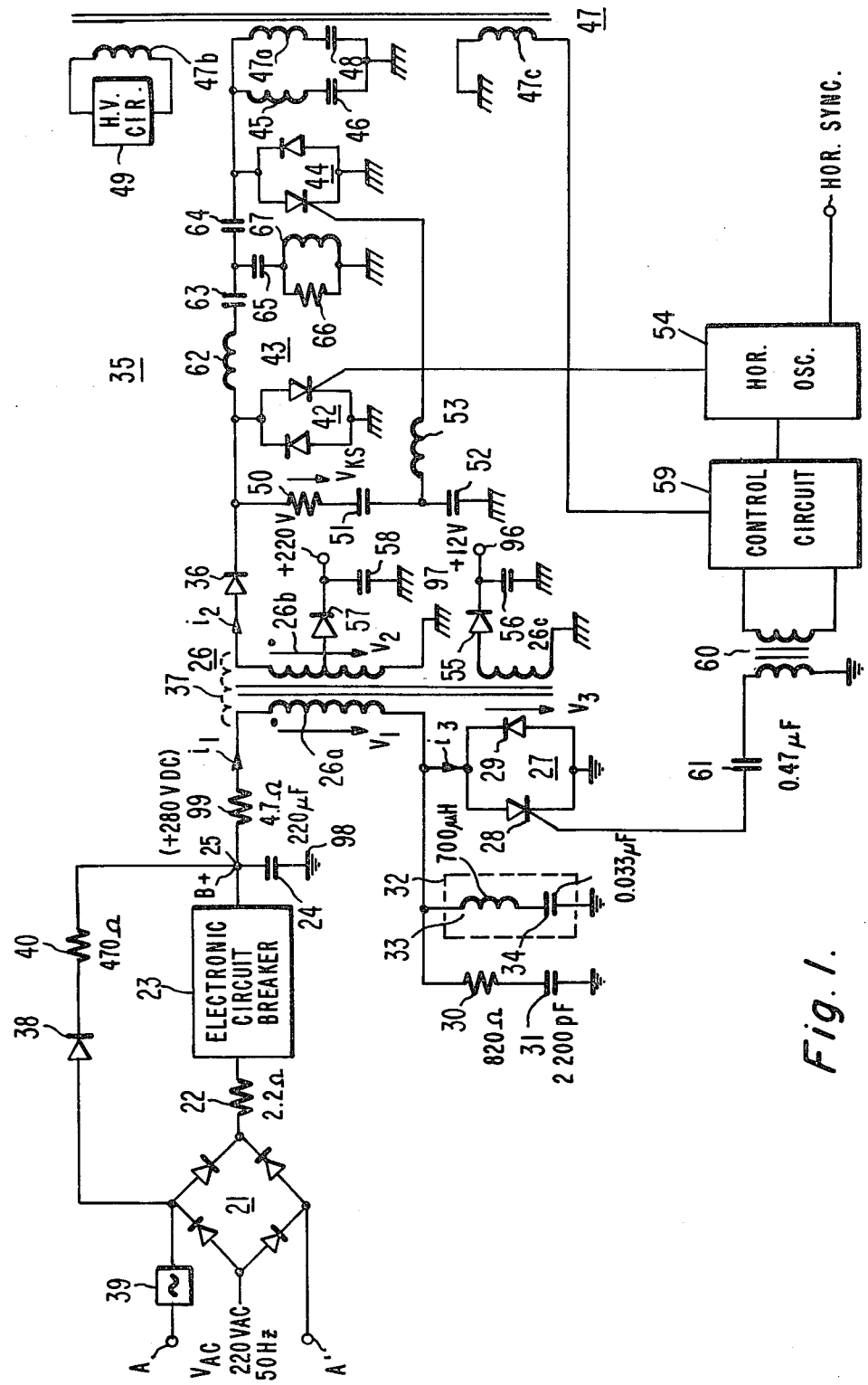
FIG. 1 illustrates a regulated deflection circuit embodying the invention.

In FIG. 1, AC line voltage at terminals A—A' is coupled through a fuse 39 to a full-wave bridge rectifier 21. The output of rectifier 21 is coupled through a resistor 22 and a conventional electronic circuit breaker 23 to one terminal 25 of a filter capacitor 24. Another terminal of capacitor 24 is coupled to a chassis isolated AC line return terminal 98. Diode 38 and resistor 40 bypass the initial open-circuited circuit breaker 23 to charge filter capacitor 24 during initial turn-on of the receiver. A filtered but unregulated B+ voltage is developed at terminal 25 and is coupled to a primary winding 26a of an isolation input transformer 26 through a resistor 99.

Coupled to a second terminal of primary winding 26a is, for example, an integrated thyristor-rectifier bidirectionally conductive regulator switch 27 comprising an SCR 28 and a parallel oppositely poled diode 29. A damping network comprising a resistor 30 and a capacitor 31 is coupled across regulator switch 27. A resonant regulator commutating circuit 32 comprising an inductor 33 and a capacitor 34 is conductively coupled across switch 27.

A terminal of secondary winding 26b of input transformer 26 is coupled to an SCR horizontal deflection circuit 35 through a diode switch 36. A second terminal of secondary winding 26b is coupled to an isolated chassis ground return 97. Windings 26a and 26b are magnetically loosely coupled to each other. The leakage inductance provides input impedance and energy storage and is indicated as a dotted inductor symbol 37. Auxiliary voltages at a terminal 96 for auxiliary loads may be obtained from a separate winding 26c through a diode 55 and a capacitor 56, or they may be obtained from a tap on winding 26b through a diode 57 and a capacitor 58.

Horizontal deflection circuit 35 comprises a commutating switch 42, a deflection commutating circuit 43 comprising elements 62–67, a trace switch 44 for generating a trace interval, a horizontal deflection winding 45 and a trace capacitor 46, and a primary winding 47a of a horizontal output transformer 47 and a DC blocking capacitor 48. A high voltage secondary winding 47b of horizontal output transformer 47 is coupled to a high voltage circuit 49 for providing an ultor voltage. Gating pulses to the SCR of trace switch 44 is provided by circuit elements 50-53. Gating pulses to the SCR of commutating switch 42 is coupled from a scan synchronized horizontal oscillator 54.

Figure 2A:
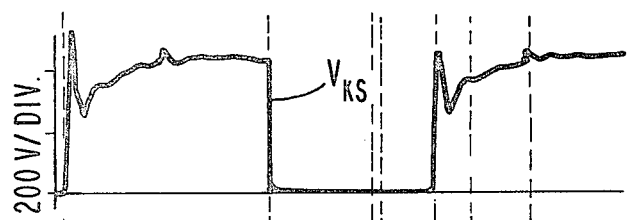
FIGS. 2a-2f and 3a-3f illustrate waveforms associated with the circuit of FIG. 1.

A control circuit 59 during each horizontal deflection cycle provides control signals through a coupling transformer 60 and a capacitor 61 to gate SCR 28 of regulator switch 27 into conduction at a controlled instant within the deflection commutation interval when commutation switch 42 is conducting. As illustrated in FIG. 2a by the voltage $V_{ks}$ across commutating switch 42, the noncommutating interval occurs between times $T_1$–$T_2$ and the commutating interval occurs between times $T_2$–$T_5$. The exact instant of turn-on of regulator switch 27 is varied in accordance with a feedback voltage developed by secondary winding 47c of flyback transformer 47 and coupled to control circuit 59.

Figure 2B:
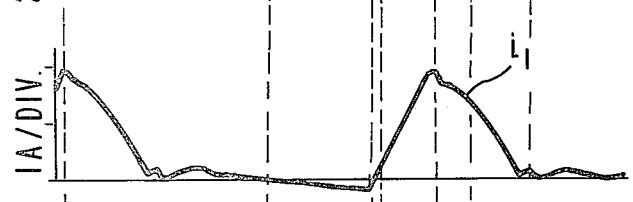
Figure 2C:
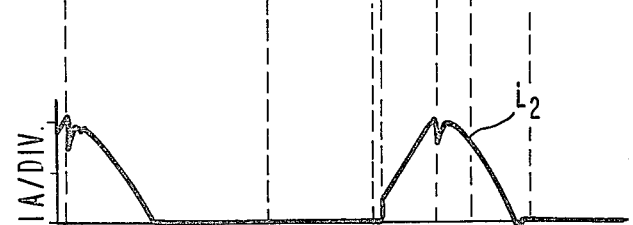

The polarities of windings 26a and 26b and of diode 36 are such as to provide substantially simultaneous conduction of regulator switch 27 and diode 36. As illustrated in FIG. 2b, primary input current $i_1$ linearly increases in primary winding 26a of input transformer 26 from time $T_3$ to time $T_5$, the beginning of the noncommutating interval. As illustrated in FIG. 2c, secondary input current $i_2$ in secondary winding 26b also increases substantially simultaneously between times $T_4$–$T_5$. No current $i_2$ flows between times $T_3$–$T_4$ when diodes 55 and 57 are still conducting. During the noncommutating interval, input currents $i_1$ and $i_2$ decreases to zero around time $T_7$. The amount of energy transferred to horizontal deflection circuit 35 is a function of the time intergral of the secondary winding 26b current $i_2$ and is controlled by the turn-on instant of switch 27.

Figure 2D:
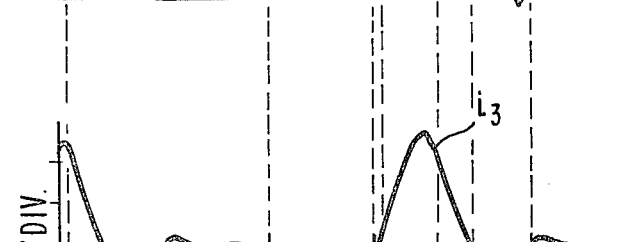

Conductively coupled resonant regulator commutating circuit 32 functions to couple a sinusoidal commutating current through regulator switch 27 beginning at time $T_3$ when regulator SCR 28 is turned on, as illustrated in FIG. 2d by the current $i_3$ flowing in regulator switch 27. The sinusoidal current first provides a positive current. At the zero crossover point, at time $T_6$, conduction through the switch is maintained by forward biasing diode 29 when SCR 28 is commutated off by the sinusoidal regulator commutating current. The negative sinusoidal current flows through diode 29 for one-half cycle. Diode 29 is commutated off at the end of a complete cycle near time when $T_7$ current attempts to reverse through diode 29, the gate enabling signal for SCR 28 having been terminated prior to this time.

As illustrated in FIG. 2d, current $i_3$ through bidirectional regulator switch 27 comprises the sum of the sinusoidal commutating current and the primary input current $i_1$ flowing through the primary winding 26a of input transformer 26. The resonant frequency of regulator commutating circuit 32 is a fixed quantity and is selected to commutate off regulator switch 27 when the currents through primary and secondary windings 26a and 26b are decreasing. When switch 27 is nonconducting, current from B+ voltage terminal 25 charges capacitor 34 of regulator commutating circuit 32 to provide the regulator commutating current for the subsequent deflection cycle.

Figure 2E:
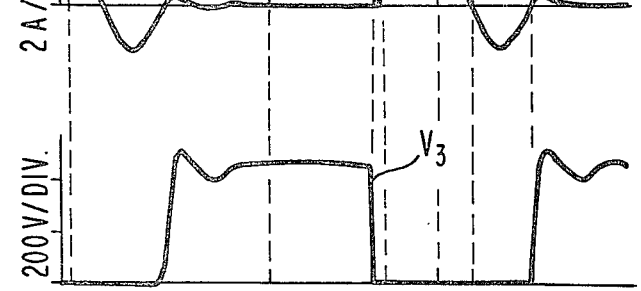
Figure 2F:
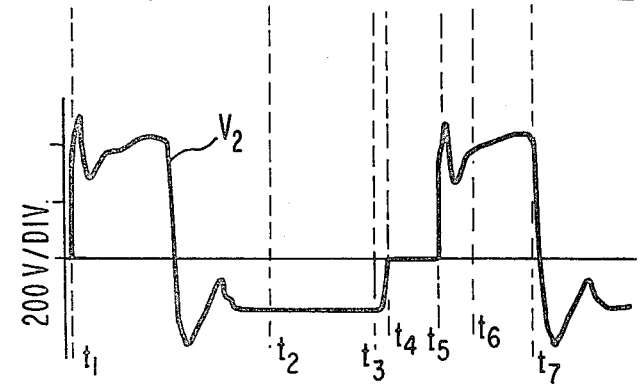
Figure 3A:
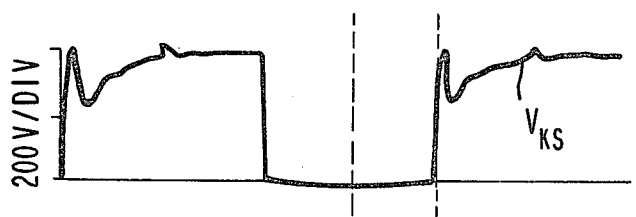
Figure 3B:
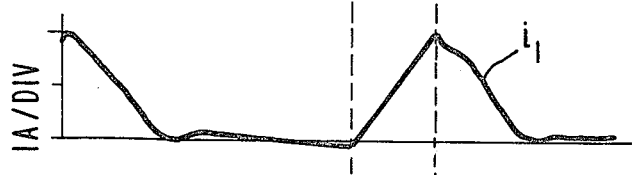
Figure 3C:
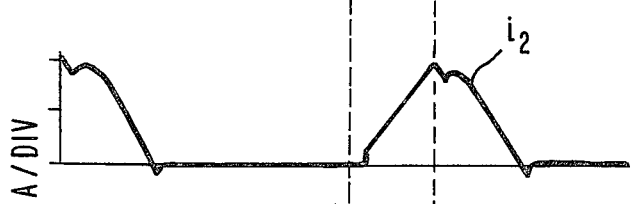
Figure 3D:
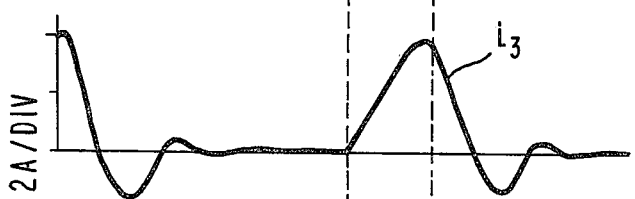
Figure 3E:
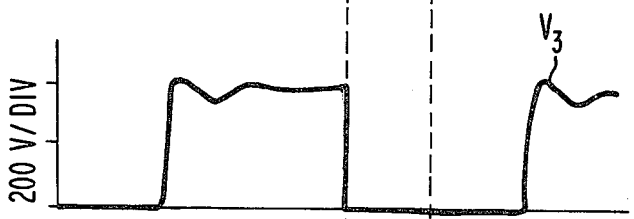
Figure 3F:
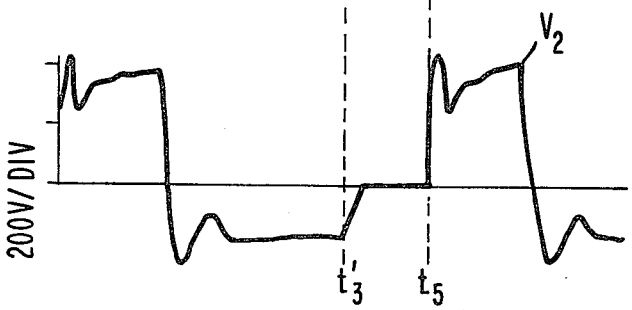

The voltage across regulator switch 27 is illustrated in FIG. 2e and equals zero between times $T_3$–$T_7$, the conduction interval of regulator switch 27. The voltage $V_2$ across secondary winding 26b is illustrated in FIG. 2f and equals zero between times $T_4$–$T_5$ when both regulator switch 27 and commutating switch 42 are conducting, and equals the commutating voltage $V_{ks}$ between times $T_5$–$T_7$ during the remaining conduction time of regulator switch 27.

Regulation is achieved by varying the turn-on instant of regulator switch 27 within the commutating interval. As illustrated in FIGS. 3a–3d for low AC line conditions of 185 volts AC, for example, the turn-on instant $T_3'$ occurs at an earlier more advanced instant when compared with the corresponding turn-on time $T_3$ for nominal line conditions of 220 volts AC, for example. To transfer the same amount of load energy at the lower B+ voltage at terminal 25, the windings currents $i_1$ and $i_2$ flow for a longer interval and reach a greater peak current magnitude. Similarly, the conduction angle of regulator switch 27 will be shortened with high AC line conditions and with load variations.

The circuit of FIG. 1 illustratively, provides safety protection under various short circuit conditions. For example, if diode 36 on the secondary side short circuits, regulator switch 27 becomes conductive for the entirety of the deflection cycle, activating electronic circuit breaker 23. Switch 27 then becomes nonconductive until the charge on filter capacitor 24 is restored through diode 38 and resistor 40. Commutation of regulator switch 27 then reoccurs and again discharges capacitor 24. The cycle repeats until fuse 39 open circuits.

The control circuit 59 may be of relatively simple inexpensive conventional design when compared to control circuits for transistorized switched mode supplies and control circuits which use transductors for element 33. In SMPS circuitry, each transistor requires a pulse width modulated drive pulse and relatively large drive power. The SMPS control circuit must generate a rectangular pulse with accurate leading and trailing edges for maintaining relatively low switching power losses. The control circuit for regulator switch 27 of FIG. 1 requires relatively little drive power and requires the generation of only a relatively simple trigger pulse. A relatively cheap and simple coupling transformer 60 may be used to isolate the hot and cold parts of the chassis.

Because each element of regulator switch 27 becomes nonconductive through current reversal caused by the sinusoidal regulator commutating current, relatively little radio frequency interference radiation is developed by regulator switch 27.

The physical size of input transformer 26 is relatively small because commutation of regulating switch 27 is performed in the primary side of transformer 26 using commutating circuit 32 coupled to regulating switch 27. Input transformer 26 is wound in such a way that the leakage inductance provides substantially all the inductance used for an SCR deflection circuit. No additional discrete inductance is required. Because of the relatively large leakage inductance, it is possible to obtain from secondary winding 26b, auxiliary power supply voltages, for vertical and video drive circuits, for example, without developing substantial picture width variations.

The primary and secondary windings 26a and 26b may be wound on two separate bobbins with a relatively large physical separation. Many of the safety requirements for an isolated TV chassis can be met without the necessity of a transformer molded in resin. The costs of such a non-molded transformer are relatively cheap when compared to a typical SMPS transformer which requires a relatively close magnetic coupling of the windings and must therefore be molded in resin.

With switches 27 and 36 conducting substantially in the simultaneous mode, a large leakage inductance may be incorporated providing for a relatively inexpensive transformer 26 construction and increased reliability. Diode 36 is not stressed by too large a reverse bias voltage.

Using a bidirectionally conductive regulator switch 27 rather than a single SCR, reduces RFI radiation. Open-circuiting of bidirectional switch 27 is accomplished by a separate discrete commutating circuit 32, conductively coupled to switch 27. The commutating voltage $V_{ks}$ across deflection commutating switch 42 is no longer required to commutate off switch 27, resulting in a simpler and less expensive construction for transformer 26 and use of a robust and relatively inexpensive ITR for switch 27. No relatively large regulator commutating currents flow in transformer 26, reducing dissipative losses.

With the resonant commutating frequency fixed by a fixed value for inductor 33, regulation is achieved by varying the turn-on instant of switch 27 rather than its turn-off instant. A relatively cheap inductor rather than a transductor may be used, and control circuit 59 may comprise any one of a number of standard integrated circuits that are commercially available.

Figure 4:
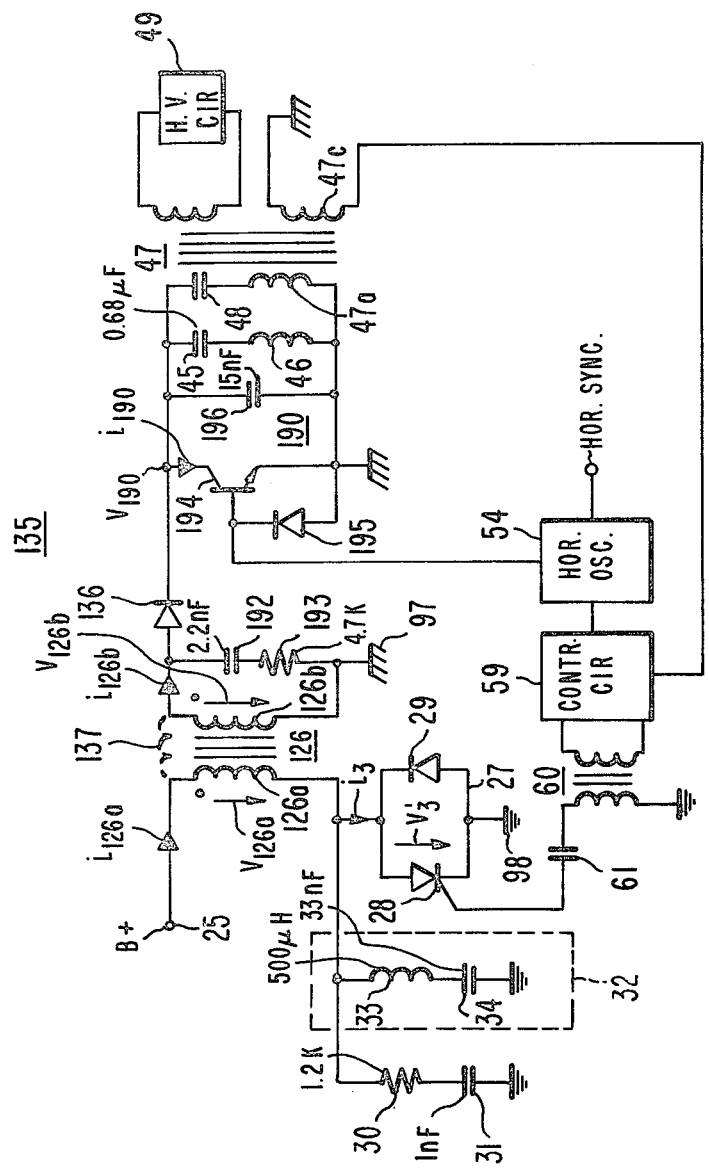
FIG. 4 illustrates another regulated deflection circuit embodying the invention.

FIG. 4 illustrates another regulated deflection circuit embodying the invention, including transistorized horizontal deflection. Circuit elements of FIGS. 1 and 4 that are identically labelled have similar functioning. The circuit of FIG. 4 includes a transistor horizontal deflection circuit 135 comprising a trace switch 190 including a horizontal output transistor 194, and a damper diode 195 coupled between the base and emitter electrodes of transistor 194 and a retrace capacitor 196.

A primary winding 126a of an isolation input transformer 126 with leakage inductance 137 is coupled to unregulated B+ terminal 25 and to bidirectionally conductive regulator switch 27. A secondary winding 126b is coupled to transistor horizontal deflection circuit 135 through a diode switch 136. A damping network comprising a capacitor 192 and a resistor 193 is coupled across secondary winding 126b.

Figure 5A:
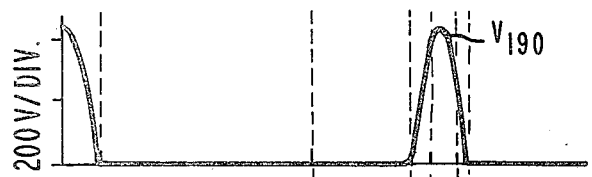
FIGS. 5a-5g illustrate waveforms associated with the circuit of FIG. 4.

As illustrated in FIG. 5a, the voltage $V_{190}$ across trace switch 190 equals approximately zero, between times $t_1$–$t_3$, during the horizontal trace interval, and equals a retrace pulse voltage between times $t_3$–$t_6$. At times $t_2$, a controlled instant in the second half of trace, control circuit 59 turns on regulator switch 27.

Figure 5B:
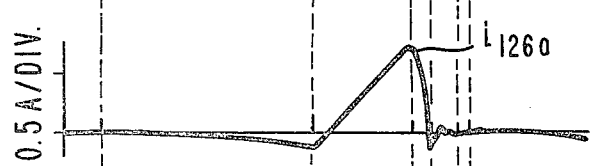
Figure 5C:
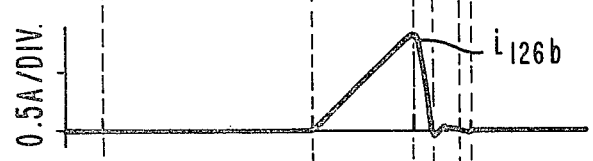
Figure 5D:
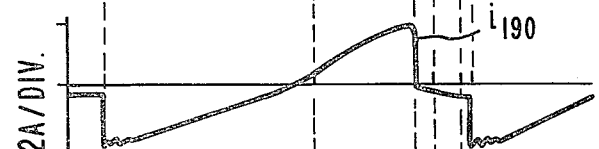

As illustrated in FIGS. 5b and 5c respectively, the currents $i_{126a}$ and $i_{126b}$ in primary and secondary windings 126a and 126b approximately linearly increase between times $t_2$–$t_3$, storing energy in leakage inductance 137. Both regulator switch 27 and the second switch, diode 136, conduct substantially simultaneously. As illustrated in FIG. 5d, the current $i_{190}$ through trace switch 190 between times $t_2$–$t_3$ equals the secondary winding current 126b plus the current flowing in deflection winding 46.

Figure 5E:

After trace switch 190 is turned off, near time $t_3$, by control signals coupled to the base or control electrode of transistor 194, the leakage inductance 137 continues to supply current, which now flows into retrace capacitor 196. As illustrated in FIG. 5c and in FIG. 5e, the voltage $V_{126b}$ across secondary winding 126b, the current $i_{126b}$ continues to flow until time $t_4$ just before the center of retrace. Near time $t_4$, the current through diode 136 attempts to reverse direction, and diode 136 becomes reverse biased by the retrace pulse. The voltage rating for diode 136 must be sufficiently great to withstand the developed retrace pulse voltage stress.

The turn-on instant of regulator switch 27 and the value of leakage inductance 137 in part determine the amount of energy supplied to horizontal deflection circuit 135 and its load coupled circuits such as high voltage circuit 49. Regulation may be achieved by varying the turn-on instant of regulator switch 27 within the second half of the trace interval. Turn-on of regulator switch 27 is selected to occur during the second half of the trace interval when horizontal output transistor 194 is in its forward conducting mode and no or little current flows in diode 195.

Figure 5F:
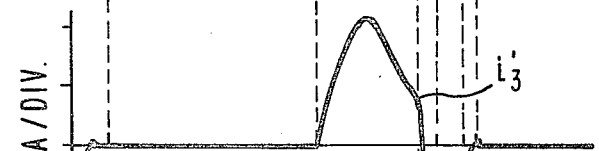
Figure 5G:
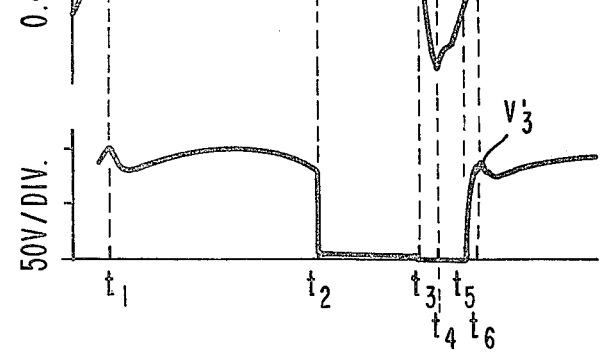

As illustrated by FIG. 5f, the current $i_3$ through regulator switch 27 and by FIG. 5g the voltage $V_3'$ across switch 27, turn-off regulator switch 27 occurs at time $t_5$ prior to the end of retrace. The current $i_3'$ substantially comprises the sum of the primary winding current $i_{126a}$ and a sinusoidal commutating current provided by regulator commutating circuit 32. After approximately one complete cycle of sinusoidal commutating current oscillation, near time $t_5$, the current in diode 29 attempts to reverse direction, thereby reverse biasing the diode. In the absence of turn-on gating signals to SCR 28, regulator switch 27 is thereby turned off.

The resonant frequency of regulator commutating circuit 32 is selected to be slightly greater than twice the horizontal deflection frequency. Turn off of regulator switch 27 will then occur in the second portion of the retrace interval prior to the beginning of the subsequent trace interval and thereby avoid undesirable interaction with horizontal deflection. The total turn-on range for regulator switch 27 is therefore slightly less than half the retrace time, since the regulator switch should turn off at or after the instant when the peak retrace voltage is reached but before the termination of retrace.

What is claimed is:
1. A regulated deflection circuit, comprising:
a deflection circuit including at least a first deflection switch for generating first and second intervals within each deflection cycle;
a source of operating voltage;
an input transformer including first and second windings magnetically loosely coupled to each other, for providing a substantial leakage inductance to the flow of current in said transformer;
bidirectional switching means series coupled with said first winding and said source of operating voltage for controlling the flow of current in said first winding;
second switching means coupled to said secondary winding and said first deflection switch, the polarities of said first and second windings and of said second switching means such as to provide substantially simultaneous conduction of said bidirectional and second switching means;
control means coupled to said bidirectional switching means and responsive to an energy level of said deflection circuit for switching said bidirectional switching means into conduction at a variable instant within one of said first and second intervals for providing regulation;
a resonant circuit coupled to said bidirectional switching means for coupling a substantially complete cycle of resonant current through said bidirectional switching means for commutating off said bidirectional switching means.

2. A circuit according to claim 1 wherein said first deflection switch comprises a commutating switch and said deflection circuit includes a trace switch and a deflection commutating circuit coupled between said trace and commutating switches.

3. A circuit according to claims 1 or 2 wherein said bidirectional switching means comprises a thyristor coupled across an oppositely poled diode.

4. A circuit according to claim 3 wherein said bidirectional switching means is switched into conduction during a commutating interval and said resonant circuit commutates off said bidirectional switching means during a noncommutating interval.

5. A circuit according to claim 1 wherein said first deflection switch includes a control terminal for turning off said first deflection switch by a control signal coupled to said control terminal.

6. A circuit according to claims 1 or 5 wherein said deflection circuit includes a resonant retrace circuit, energy stored in said leakage inductance being transferred to said resonant retrace circuit during a resonant retrace interval.

7. A circuit according to claim 6 wherein said bidirectional switching means is commutated off at or after the instant when the peak retrace voltage is developed and before termination of retrace.

* * * * *